(12) United States Patent
Phillips et al.

(10) Patent No.: US 10,707,890 B2
(45) Date of Patent: Jul. 7, 2020

(54) SAMPLING CIRCUITRY (71) Applicant: CAMBRIDGE CONSULTANTS LIMITED, Cambridge, Cambridgeshire (GB)

(72) Inventors: Desmond Phillips, Cambridge (GB); Bryan James Donoghue, Cambridge (GB)

(73) Assignee: CAMBRIDGE CONSULTANTS LIMITED, Cambridge, Cambridgeshire (GB)

(*) Notice: Subject to any disclaimer, the term of this patent is extended or adjusted under 35 U.S.C. 154(b) by 0 days.

(21) Appl. No.: 15/793,514

(22) Filed: Oct. 25, 2017

(65) Prior Publication Data
US 2018/0115318 A1  Apr. 26, 2018

(30) Foreign Application Priority Data

Oct. 25, 2016 (GB) .................................. 1618040.8

(51) Int. Cl.
*H03M 1/00* (2006.01)
*H03M 1/12* (2006.01)
*H03M 3/00* (2006.01)
*H03M 1/50* (2006.01)

(52) U.S. Cl.
CPC ......... *H03M 1/1245* (2013.01); *H03M 1/504* (2013.01); *H03M 3/494* (2013.01)

(58) Field of Classification Search
CPC .......... H03M 1/12; H03M 3/43; H03M 3/456; H03M 1/0836; H03M 1/34; H03M 3/30; H03M 3/38; H03M 1/1023

USPC .......................................... 341/155, 139–143
See application file for complete search history.

(56) References Cited

U.S. PATENT DOCUMENTS

| | | | |
|---|---|---|---|
| 5,204,635 A | 4/1993 | Takeuchi | |
| 6,275,540 B1* | 8/2001 | Barrett, Jr. .......... | H04B 1/0003 341/143 |
| 8,285,240 B2* | 10/2012 | Seendripu ............. | H03D 3/007 455/303 |
| 8,547,135 B1* | 10/2013 | Yarlagadda .............. | G06F 1/26 326/38 |
| 8,660,214 B1* | 2/2014 | Huynh .................. | G06F 17/141 375/324 |

(Continued)

FOREIGN PATENT DOCUMENTS

| | | |
|---|---|---|
| GB | 1450989 A | 9/1976 |
| KR | 20100097836 A | 9/2010 |
| WO | 2016/063038 A1 | 4/2016 |

OTHER PUBLICATIONS

Search Report for British Patent Application No. 1618040.8, dated Dec. 29, 2016.

*Primary Examiner* — Linh V Nguyen
(74) *Attorney, Agent, or Firm* — Merchant & Gould P.C.

(57) ABSTRACT

A circuit is for sampling an analog input signal that receives and samples an analog input signal. Sampling circuitry is clocked at a sampling frequency and samples the analog input signal at a rate corresponding to the sampling frequency. The sampling circuitry includes at least one pulse density modulator that includes a comparator configured to be clocked at the sampling frequency, to provide bandpass sampling of the analog input signal at the sampling frequency, and to produce a corresponding pulsed output that is pulse density modulated based on the analog input signal.

22 Claims, 5 Drawing Sheets

(56) References Cited

U.S. PATENT DOCUMENTS

| | | | | |
|---|---|---|---|---|
| 9,312,895 | B1* | 4/2016 | Gupta | H04B 1/10 |
| 2004/0152418 | A1* | 8/2004 | Sinha | H04L 27/0002 |
| | | | | 455/42 |
| 2006/0239389 | A1* | 10/2006 | Coumou | H03M 1/0836 |
| | | | | 375/346 |
| 2009/0168843 | A1* | 7/2009 | Waters | G01S 19/34 |
| | | | | 375/130 |
| 2010/0301928 | A1* | 12/2010 | Barth | H04B 1/0028 |
| | | | | 327/557 |
| 2011/0285568 | A1* | 11/2011 | Harpe | H03M 1/56 |
| | | | | 341/158 |
| 2013/0142232 | A1* | 6/2013 | Lee | H04L 27/06 |
| | | | | 375/222 |
| 2014/0340249 | A1* | 11/2014 | Bernardinis | H03M 3/47 |
| | | | | 341/143 |
| 2016/0094249 | A1* | 3/2016 | Naeini | H04B 1/0021 |
| | | | | 455/189.1 |
| 2016/0248438 | A1* | 8/2016 | Lachartre | H03M 1/125 |
| 2017/0187414 | A1* | 6/2017 | Talty | H04B 1/1036 |

* cited by examiner

SAMPLING CIRCUITRY

This application claims benefit of GB 1618040.8, filed Oct. 25, 2016 in the United Kingdom which application is incorporated herein by reference. To the extent appropriate, a claim of priority is made to the above disclosed application.

BACKGROUND OF THE INVENTION

The present invention relates to sampling circuitry and in particular, but not limited to sampling circuitry for use in converting analog signals into digital signals and to related analog to digital conversion circuitry. The invention has particular although not exclusive relevance to an 'all-digital' method, and associated apparatus, for converting analog real-valued radio frequency signals into digital signals suitable for implementing an 'all-digital' radio receiver, and to radio receiver/transceiver apparatus that implements such a method.

Circuit design engineers are increasingly faced with the often conflicting challenges of providing increased functionality whilst, at the same time reducing both the size of circuit real estate and power consumption. Coupled with short design cycles, the challenges of efficient analog design and the comparative ease with which digital designs can be verified, this has contributed to an increase in the preference for digital design solutions.

As products become more complex and increasingly portable the number of analog-to-digital converters (ADCs) that are required to support such digital solutions increases. Moreover, as the cost of programmable digital devices, such as Field Programmable Gate Arrays (FPGAs) comes down their popularity for implementing such digital solutions increases. However, as FPGA's become more popular, and products become more complex and portable, there is a corresponding increase in the relative importance of mixed-signal circuit integration and, in particular, the integration of ADCs, digital-to-analog converters (DACs), and power circuits.

Digital implementations of DACs, in the form of Sigma-Delta DACs, are now relatively popular. More recently, a digital ADC has also been proposed that uses a Low Voltage Differential Signal (LVDS) input on an FPGA, with low pass resistor-capacitor feedback, to provide low-pass sampling. However, whilst these solutions offer efficient integration of DACs and ADCs with FPGAs the range of frequencies that they can operate with is relatively low (e.g. audio frequency) which acts as a constraint on the applications in which they can be used.

International Patent Application number WO2015GB53126, which published as WO2016063038, discloses a delta-sigma modulator circuit suitable for operation with much higher (radio) frequencies. The sigma-delta modulator circuit is therefore suitable for use in implementing an all-digital radio transmitter system which can be implemented, for example, using an FPGA or application specific integrated circuit (ASIC).

There is, however, a need for an improved circuitry that may be used to digitally implement an ADC that could, for example, be used at higher (e.g. radio) frequencies. Such an ADC would, for example, be useful for implementing an 'all-digital' (or at least mostly digital) radio receiver.

SUMMARY OF THE INVENTION

The present invention seeks to provide apparatus and associated methods for meeting or at least partially contributing to the above need(s).

In one aspect there is provided a circuit for sampling an analog input signal, the circuit: means for receiving an analog input signal; means for sampling the analog input signal; and means for clocking the sampling means at a sampling frequency wherein the sampling means samples the analog input signal at a rate corresponding to the sampling frequency; wherein the sampling means comprises at least one pulse density modulator, wherein each pulse density modulator comprises a respective comparator that is configured to be clocked by the clocking means at the sampling frequency, to provide bandpass sampling of the analog input signal at the sampling frequency, and to produce a corresponding pulsed output that is pulse density modulated based on the analog input signal.

The sampling means may be arranged to down-convert the analog input signal from a carrier frequency associated with the analog input signal to a baseband frequency or to an intermediate frequency (e.g. substantially equal to a difference between the sampling frequency and the carrier frequency). The analog input signal may comprise at least one of a radio frequency signal and a signal derived from a radio frequency signal. The analog input signal may have an associated carrier frequency and the sampling frequency: may be equal to the carrier frequency; is offset from the carrier frequency by at least a desired bandwidth; or may be an integer divisor of the carrier frequency; whereby to down-convert the analog input signal from the carrier frequency to baseband or to an intermediate frequency.

Each pulse density modulator may comprise a feedback circuit. The feedback circuit may be configured to provide closed-loop negative feedback. The feedback circuit may comprise a resistor-capacitor circuit. The resistor-capacitor circuit may have an associated time constant configured to provide a predetermined bandwidth, wherein a maximum bandwidth of a signal which can be down-converted by the sampling means may be proportional to the predetermined bandwidth of the resistor-capacitor circuit.

The means for sampling may comprise a plurality of such pulse density modulators each arranged to produce a respective pulse density modulated output based on the analog input signal. The clocking means may be arranged to clock the respective comparator of each pulse density modulator of the plurality of pulse density modulators with a different respective delay to cause each pulse density modulator to sample the analog input signal at a different respective phase offset. The plurality of pulse density modulators may comprise two pulse density modulators the comparators of which may be clocked with a relative clock delay arranged to cause the two pulse density modulators to sample the analog input signal at a relative phase offset of 90 degrees (e.g. with respect to a carrier signal associated with the analog input signal). The different respective delays may be configured to cause each pulse density modulator to sample the analog input signal at a phase offset of 360/M degrees where M is the number of pulse density modulators.

The circuit may further comprise circuitry for calibrating and storing the different respective delays. The circuit may further comprise a digital signal processor configured for precise recombination of PDM signals output from the pulse density modulators back into in-phase and quadrature components using the different respective delays stored by the calibrating and storing circuitry. The circuit may be implemented digitally. The sampling frequency may be derived from a programmable-frequency clock generator. The circuit may be implemented using a field programmable gate array or application specific integrated circuit (ASIC).

In one aspect there is provided an analog to digital converter comprising a circuit according to an aspect set out above.

In one aspect there is provided a radio receiver comprising a circuit according to an aspect set out above. The radio receiver may be configured to use the circuit according to an aspect set out above at an Intermediate Frequency (IF).

In one aspect there is provided a radio transceiver comprising a circuit as according to an aspect set out above.

In one aspect there is provided a method for sampling an analog input signal, the method comprising: receiving an analog input signal; sampling the analog input signal at a sampling frequency wherein the sampling comprises clocking a comparator of least one pulse density modulator at the sampling frequency; and bandpass sampling the analog input signal, using the comparator, at the sampling frequency to produce a corresponding pulsed output that is pulse density modulated based on the analog input signal.

The method may further comprise down-converting the analog input signal from a carrier frequency associated with the analog input signal to a baseband frequency or to an intermediate frequency (e.g. substantially equal to a difference between the sampling frequency and the carrier frequency). The analog input signal may comprise at least one of a radio frequency signal and a signal derived from a radio frequency signal. The analog input signal may have an associated carrier frequency and the sampling frequency: may be equal to the carrier frequency; is offset from the carrier frequency by at least a desired bandwidth; or may be an integer divisor of the carrier frequency; whereby to down-convert the analog input signal from the carrier frequency to baseband or to an intermediate frequency.

Each pulse density modulator may comprise a feedback circuit. The feedback circuit may be configured to provide closed-loop negative feedback. The feedback circuit may comprise a resistor-capacitor circuit. The resistor-capacitor circuit may have an associated time constant configured to provide a predetermined bandwidth, wherein a maximum bandwidth of a signal which can be down-converted by the sampling means may be proportional to the predetermined bandwidth of the resistor-capacitor circuit.

The sampling may comprise clocking a respective comparator of each of a plurality of such pulse density modulators, each pulse density modulator being arranged to produce a respective pulse density modulated output based on the analog input signal. The clocking may comprise clocking the respective comparator of each pulse density modulator of the plurality of pulse density modulators with a different respective delay to cause each pulse density modulator to sample the analog input signal at a different respective phase offset. The plurality of pulse density modulators may comprise two pulse density modulators the comparators of which are clocked with a relative clock delay arranged to cause the two pulse density modulators to sample the analog input signal at a relative phase offset of 90 degrees (e.g. with respect to a carrier signal associated with the analog input signal). The different respective delays may be configured to cause each pulse density modulator to sample the analog input signal at a phase offset of 360/M degrees where M is the number of pulse density modulators.

The method may further comprise calibrating and storing the different respective delays. The method may further comprise using a digital signal processor to recombine precisely PDM signals output from the pulse density modulators back into in-phase and quadrature components using the different respective delays stored by the calibrating and storing circuitry. The method may be performed using all digital circuitry. The method may further comprise deriving the sampling frequency from a programmable-frequency clock generator. The method may be performed using a field programmable gate array or application specific integrated circuit (ASIC).

Aspects of the invention extend to computer program products such as computer readable storage media having instructions stored thereon which are operable to program a programmable processor to carry out a method as described in the aspects and possibilities set out above and/or to program a suitably adapted computer to provide an apparatus.

Each feature disclosed in this specification (which term includes the claims) and/or shown in the drawings may be incorporated in the invention independently (or in combination with) any other disclosed and/or illustrated features. In particular but without limitation the features of any of the claims dependent from a particular independent claim may be introduced into that independent claim in any combination or individually.

BRIEF DESCRIPTION OF THE DRAWINGS

Embodiments of the invention will now be described by way of example only with reference to the attached figures in which.

DETAILED DESCRIPTION OF THE PREFERRED EMBODIMENTS

Figure 1:
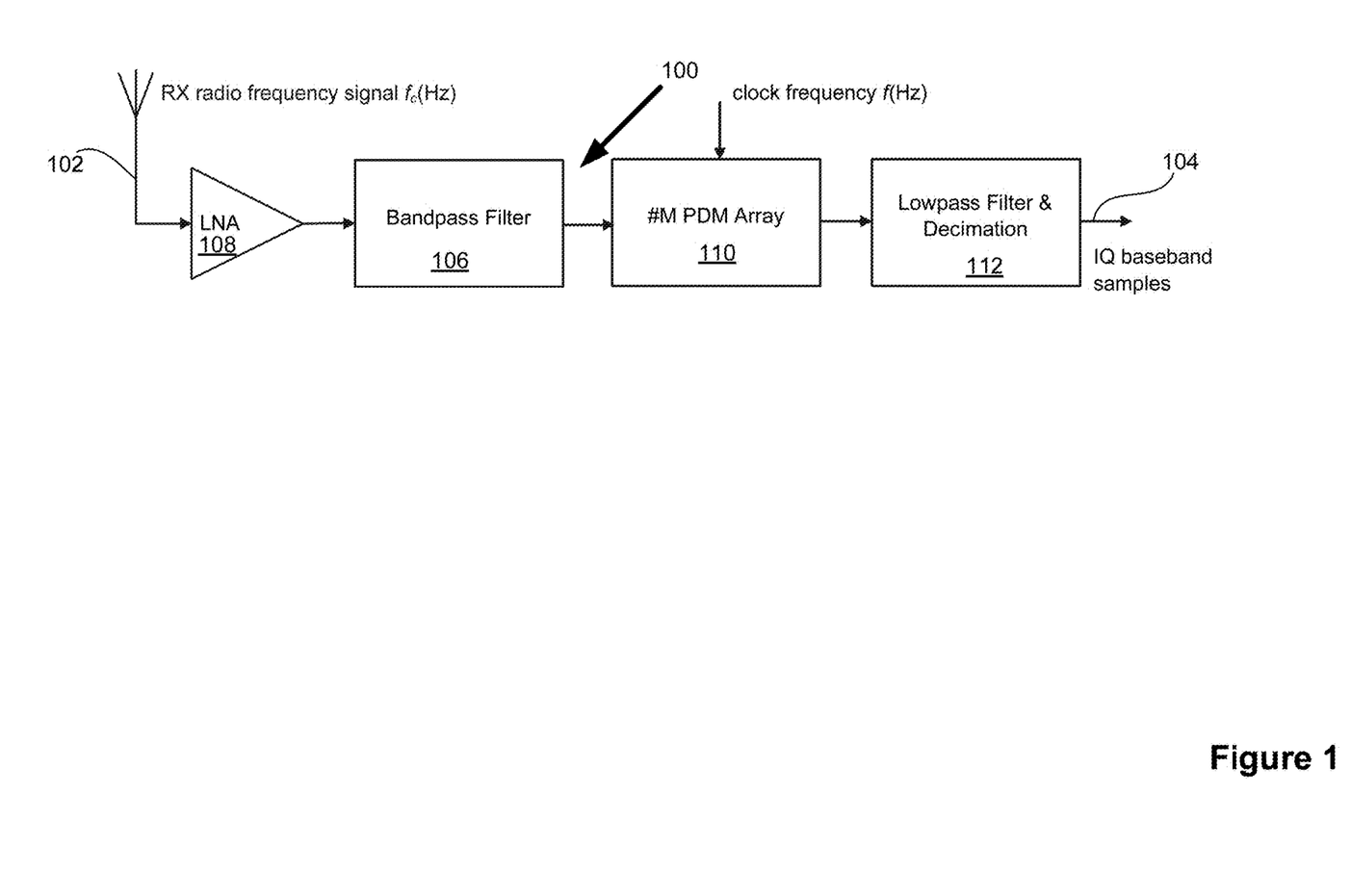
FIG. 1 is a simplified block diagram illustrating the main functional blocks of a radio receiver.

FIG. 1 shows, generally at 100, a radio receiver front end for converting radio frequency (RF) signals, having a carrier frequency $f_c$, and received at an antenna 102 into in-phase and quadrature (IQ) signals at output 104.

The radio receiver front end comprises a low noise amplifier (LNA) 108 arranged to amplify the incoming RF signals received at the antenna 102. The LNA 108 provides the amplified signal to the input range of comparator supply rails forming part of an analog-digital converter (ADC). Following the LNA 108 is a bandpass filter 106 which is, in effect, an anti-aliasing filter (AAF) that provides a band limited ('narrowband') output signal that (at least approximately) satisfies the Nyquist-Shannon sampling theorem over the band of interest.

Beneficially the ADC is an 'all-digital' ADC which, in this example, uses an array 110 comprising a number (# M) of pulse density modulation (PDM) modulator structures, each operating at a respective fixed phase offset relative to one another (and with respect to the carrier signal), to convert the incoming amplified signal into a respective PDM output signal. As will be described in more detail later, each PDM structure of the ADC 110, in this example, makes beneficial use of a respective latched comparator (also known as a 'clocked' or 'dynamic' comparator), with closed-loop negative feedback, to generate a respective PDM signal.

In this example, each latched comparator comprises a fast voltage comparator, arranged to provide a binary decision on a comparison of input voltages, followed by an edge triggered single-bit register (e.g. a D-type flip-flop) which samples the comparator output. It will be appreciated that, in reality there is a small but finite window where the voltage comparison is taken (known as the "aperture time") but, for the purposes of the ADC described herein this may be considered to be insignificant.

Accordingly, when each PDM structure is clocked at the same respective frequency $f_{sample}$, it effects (by virtue of the relatively short aperture time) bandpass sampling of the amplified narrowband input signals at integer multiples of $f_{sample}$. Most typically, the digital clocking frequency will be at or near to the radio carrier frequency $f_c$. Advantageously, by sampling at or near to the carrier frequency the desired signal can, in effect, be down-sampled to a baseband frequency (which may be substantially zero) or a low intermediate carrier frequency. For example, by offsetting the sampling frequency from the radio carrier frequency ($f_c$) by a margin greater than the bandwidth of the signal of interest, the desired signal can, advantageously, be down-sampled to a low intermediate carrier frequency equal to $f_{sample}-f_c$.

Figure 2:
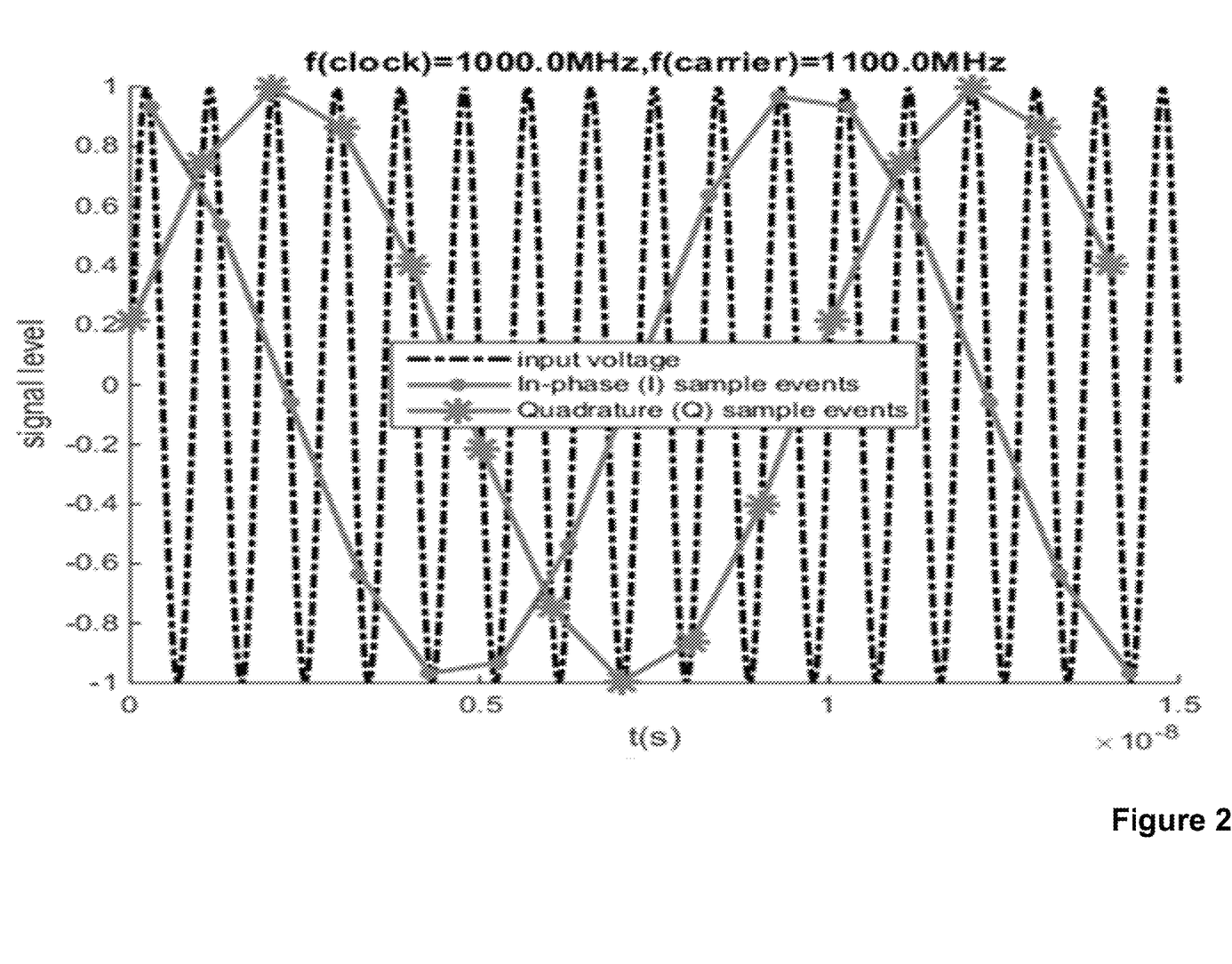
FIG. 2 is a simplified voltage-time plot illustrating in-phase and quadrature sampling of an analog signal that may be implemented in the radio receiver of FIG. 1.

In order to capture a radio signal, at least two or more PDM structures are used at constant phase offsets in order to generate an appropriate format of in-phase and quadrature (IQ) baseband signals. In this arrangement, therefore, two PDM structures are used with exactly a 90 degrees phase offset between them (with respect to the sampling clock frequency signal associated with the received radio signals). By way of illustration only, FIG. 2 shows an example of such IQ sampling for an approximate 1100 Mhz real valued sinusoidal RF input signal being sampled at a clock frequency of 1000 MHz. This results in a complex IQ signal with a first harmonic at +100 Mhz. The process can be thus be viewed as a mix-down of the input signal by the sample clock frequency.

It will be appreciated that, whilst the specific example uses two PDM structures, one of the advantages of the ADC design is that the number of PDM structures and corresponding phasing are flexible and any appropriate number of PDM structures may be used depending on requirements. For example, M PDM modulator structures could be used spaced by phase offsets substantially equal to 360/M degrees apart from one another. Beneficially, the phases may be calibrated, using appropriate digital signal processing to apply appropriate delays and complex-valued rotations, and stored.

It will be appreciated that whilst the ADC ideally uses at least two PDM structures to achieve capture of a wanted radio signal, a single PDM structure could, beneficially, be used to achieve the down-sampling to baseband or an intermediate frequency described above.

The PDM output signals from the ADC PDM modulators are input to digital (low-pass) filtering and decimation (in the functional block labelled 112) to extract the desired high quality multi-bit baseband time-series. The filtering and decimation comprises digital signal processing (DSP) of the multiple PDM streams to filter and recombine the signal into a high-fidelity IQ baseband stream. The clock phase delays (previously calibrated and stored) are beneficially post-compensated for during this DSP. This filtering and decimation beneficially deals with any unwanted high-pass additive noise component, on top of the desired low frequency input signal, arising as a result the PDM structures' continual modulation of the output.

In overview, therefore, it can be seen that the ADC circuitry described above exploits PDM to provide an RF capable 'all-digital' bandpass ADC by the advantageous use of bandpass sampling. The ADC circuitry provides an all-digital method for converting analog real-valued radio frequency signals into digital signals. Unlike alternative radio frequency bandpass Analog to Digital Converters (ADCs), there are no discrete time sampling structures, on the input voltage paths, that are driven by digital clocks. The input signal processing requirements are all continuous time and include anti-alias filtering via a bandpass filter and amplification up to the input range of the comparator rails via a Low Noise Amplifier (LNA).

ADC PDM Modulator Circuitry

Figure 3:
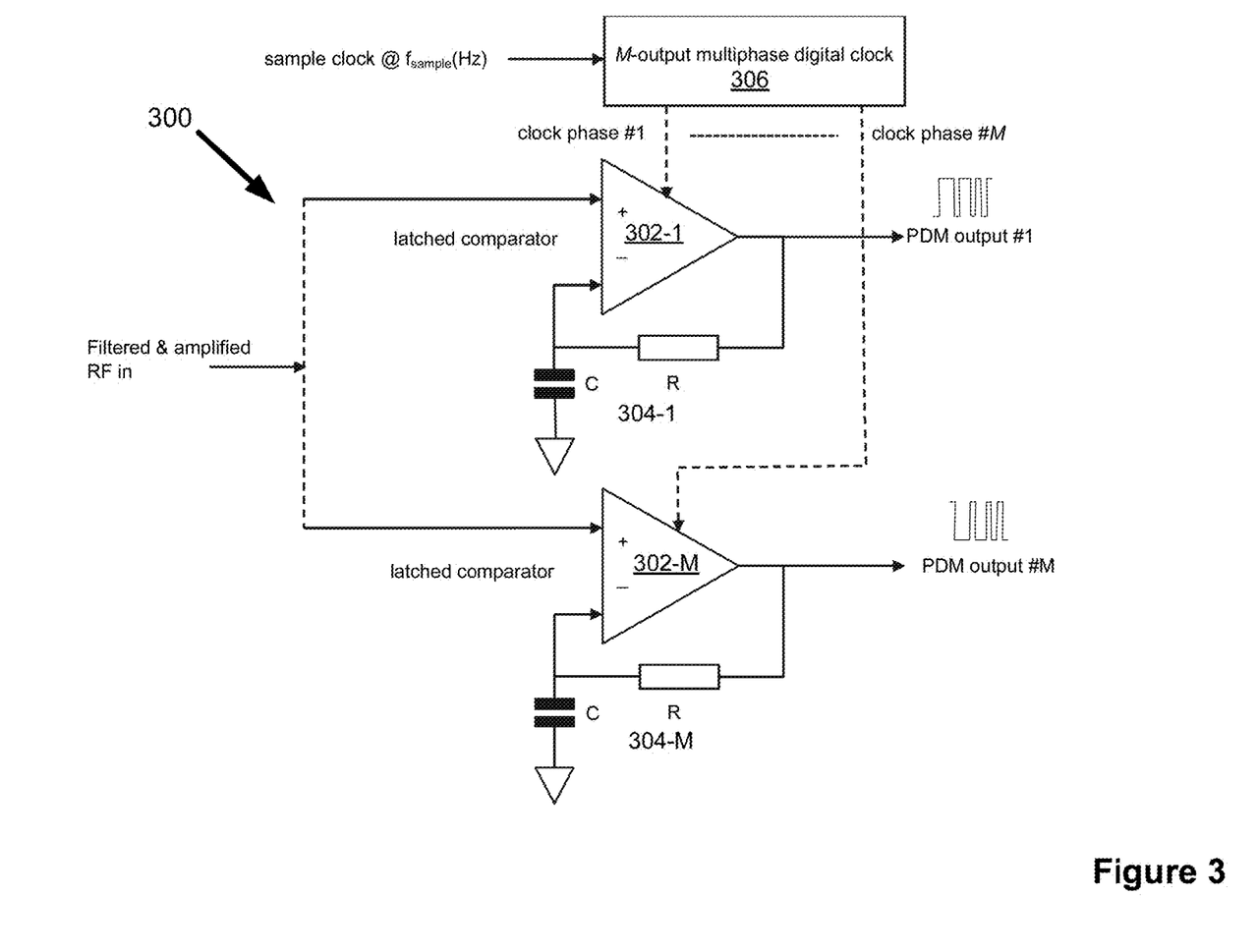
FIG. 3 is a simplified circuit diagram illustrating how part of the radio receiver of FIG. 1 may be implemented.

FIG. 3 shows, generally at 300, circuitry that may be employed to implement the ADC 110 of FIG. 1.

As seen in FIG. 3, the circuit 300 comprises a plurality of (M) latched comparators 302-1 to 302-M. In this example, each latched comparator 302 provides an output that is equal to the comparator's positive supply voltage when the voltage on the respective positive ('+') input is greater than that on the respective negative ('−') input. Conversely, each latched comparator 302 provides an output that is equal to the comparator's negative supply voltage when the voltage on the respective positive ('+') input is less than that on the respective negative ('−') input.

Each latched comparator 302 is provided with a respective first-order passive resistor-capacitor (RC) filter circuit 304-1 to 304-M arranged, as illustrated, to provide closed-loop negative feedback from the output to the negative input of the corresponding latched comparator 302. By applying closed-loop negative feedback in this way, a pulse density modulator is formed. Each respective RC network 304 averages out the sampled digital output of the comparator so as to approximate the voltage observed at the positive input of the comparator 302, at the periodic sampling events.

Accordingly when, at one sampling event, the voltage on the capacitor of the RC circuit 304, is less than the instantaneous input voltage, then a +1 decision is output during the following cycle. Hence, the output from the comparator will be equal to the supply voltage which, by virtue of the feedback circuit, will tend to increase the voltage on the capacitor. Similarly when, at one sampling event, the voltage on the capacitor of the RC circuit 304 is greater than the instantaneous input voltage, then a −1 decision is output during the following cycle, which will tend to decrease the voltage on the capacitor. In this way a digital pulse train to be output from the comparators 302 and the negative feedback causes the average voltage of the digital pulse train to tend to match the input voltage to the comparator observed during a train of sampling events.

It will be appreciated that, as the PDM structure continually modulates the output, there is generally an unwanted high-pass additive noise component on top of the desired low frequency input signal. As explained above, the subsequent digital filtering and decimation is therefore used to extract the desired high quality multi-bit baseband time-series.

As those skilled in the art will appreciate, the time constant ti of the RC circuit 304 affects the rate at which the voltage on the feedback capacitor responds to changes at the output of the comparator 302 and hence affects the bandwidth of a signal which can be tracked. In effect, the bandwidth of a signal which can be tracked is proportional to the bandwidth of the RC feedback circuit 304. High bandwidth signals change very quickly and will benefit from a small time constant $\tau$. Low bandwidth signals change more slowly quickly and will benefit from a higher time constant τ. The Effective Number of Bits (ENOB) of the ADC is determined by the amount of quantisation noise rejection that is effected during filtering and decimation. For high bandwidth signals, the amount of filtering and decimation required is less than low bandwidth signals and therefore the ENOB is lower.

Each latched comparator 302 is clocked by a respective output of an M-output multiphase digital clock 306. The clock phase of each output is shifted, by a different amount, with the different clock shifts configured to provide the desired phase shift associated with the corresponding comparator 302.

The PDM structure is clocked at a frequency $f_{sample}$. Accordingly, bandpass sampling of narrowband input signals are effected at integer multiples of $f_{sample}$. Typically, the digital clocking frequency, $f_{sample}$, will be selected to be at or near to the radio carrier frequency $f_c$. It will be appreciated that the upper bound on the radio carrier frequency offset ($f_{sample}-f_c$) is set by ($1/2\pi\tau$), the ADC signal bandwidth. If $f_{sample}$ and $f_c$ are slightly different (but the frequency bandwidth constraint is satisfied with respect to $f_{sample}$), then the ADC architecture can be said to be operating at an intermediate frequency (IF) of ($f_{sample}-f_c$).

Figure 4:
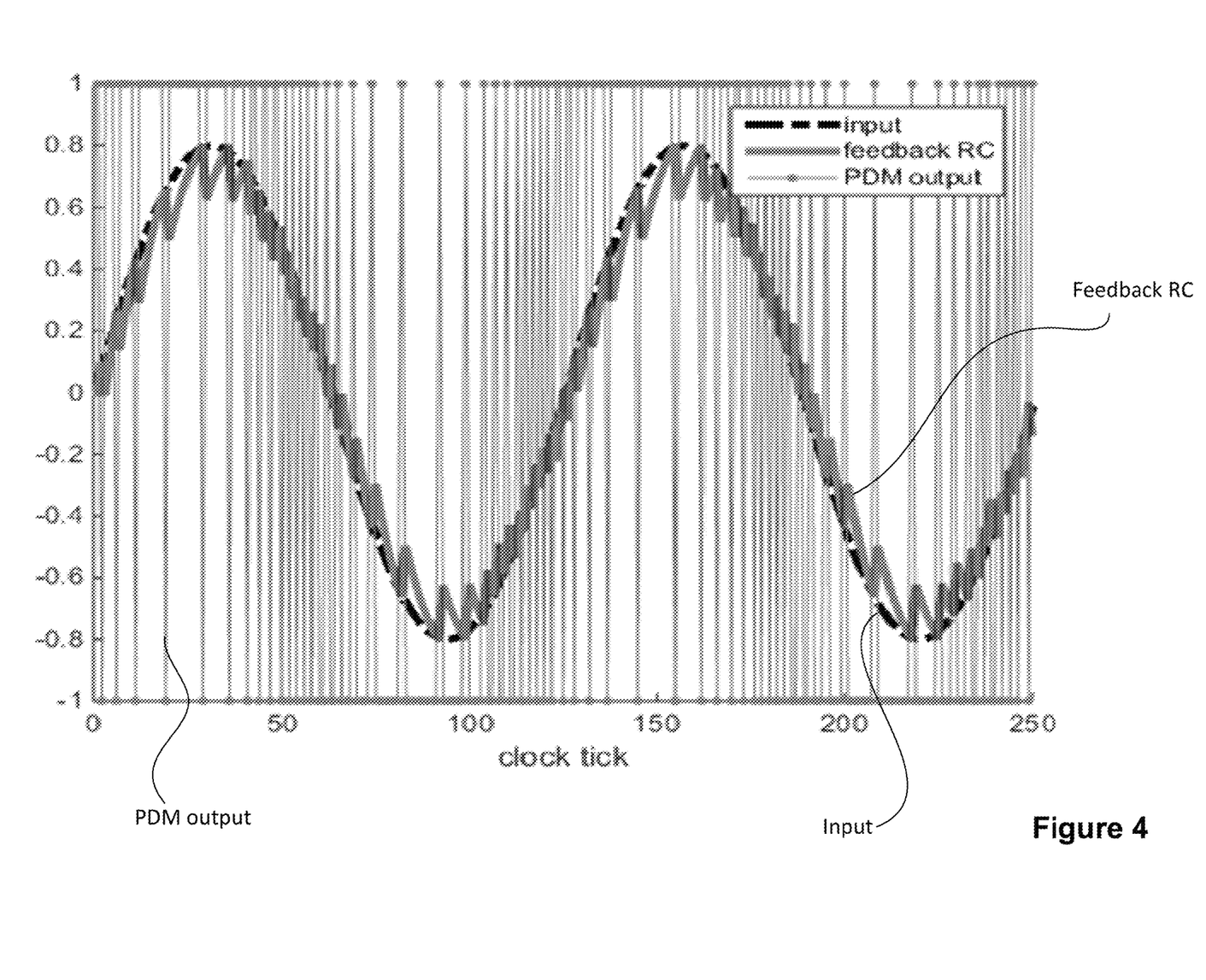
FIG. 4 illustrates digitisation of an input sinusoid that may be produced by the circuit of FIG. 3.

FIG. 4 shows, by way of example only, PDM digitisation of an input sinusoid produced using a PDM modulator based ADC as described above. In the illustrated example, the input sinusoid has an amplitude of approximately 0.8 at 0.05 radians/sample and the comparator range could be considered to have supply rails of {−1, +1} volts. The RC time constant ti (where t=RC) is set equal to have a −3 dB bandwidth of ±0.01675*$f_{sample}$. It will be appreciated that the input signal could be a baseband signal, or could be a sinusoid at $f_{sample}(1\Delta)$ (where $\Delta=0.05/2\pi$) that is then sampled according to the bandpass sampling property explained previously such that it is down-sampled to a baseband sinusoid at $\Delta f_{sample}=(0.05/2\pi)f_{sample}$ Hz.

As seen in FIG. 4, the PDM output follows the input voltage causing the feedback RC to approximate the input voltage.

Figure 5:
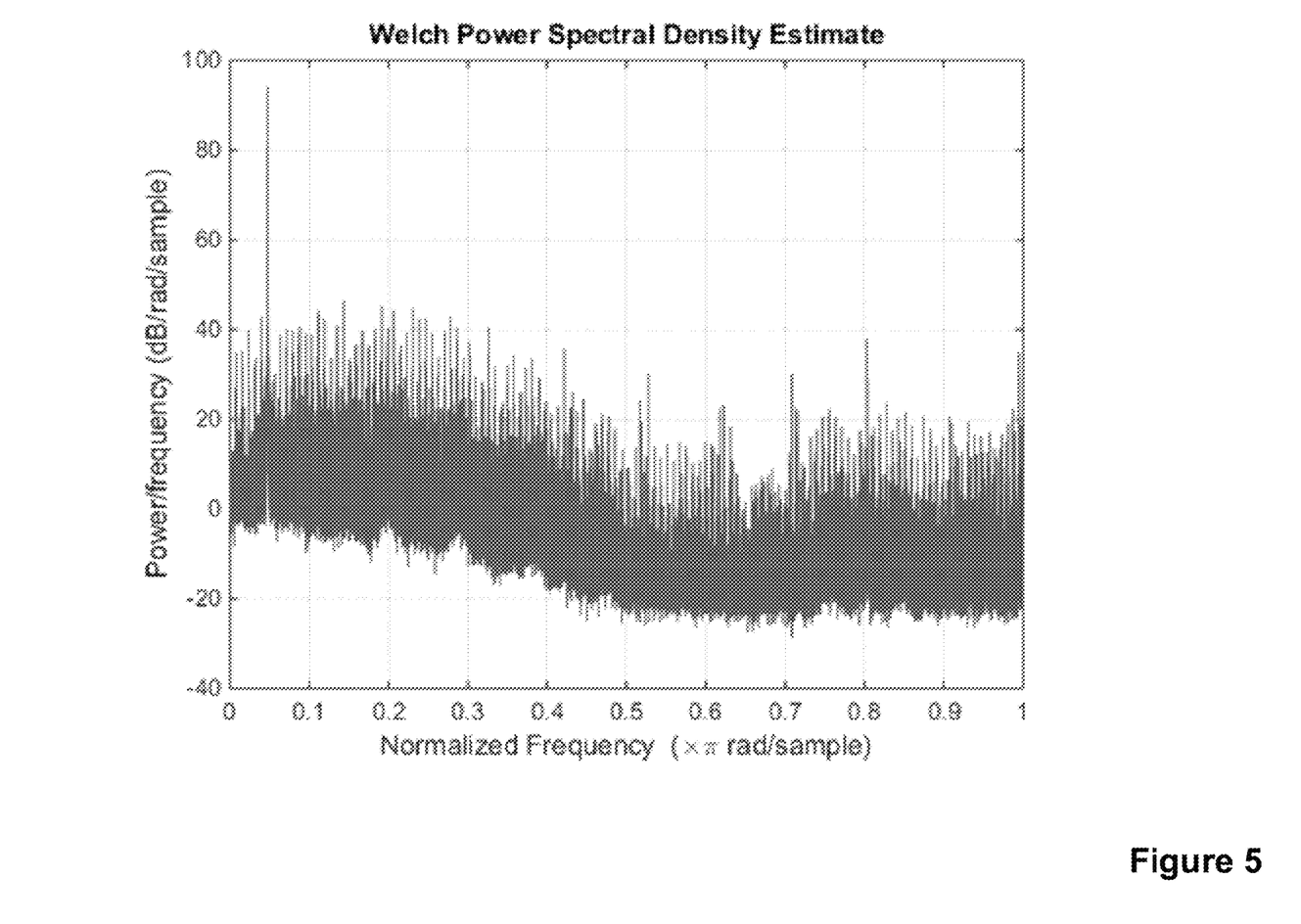
FIG. 5 illustrates a power spectral density of an exemplary RF signal following low-pass filtering and decimation in the receiver of FIG. 1.

FIG. 5 shows, by way of illustration only, the power spectral density of an exemplary RF signal, following filtering and decimation.

Continuing the example of FIG. 4, the output signal from the comparator can be filtered by a $3^{rd}$ order Cascaded Integrator-Comb (CIC) decimating filter which low-pass filters and decimates by a factor of 10 with respect to the clock rate (to produce a signal bandwidth roughly equivalent to the ($1/2\pi\tau$) bandwidth set by the example RC time constant). Taking a normalised Power Spectral Density (PSD), the output shown in FIG. 5 shows the filtered and decimated output waveform captured with a Spur Free Dynamic Range (SFDR) of about 50 dB in-band giving an ENOB=8 bits (ENOB=(SNR(dB)−1.76)/6.02). It can be seen therefore, that in this example, the signal has been successfully digitised to an ENOB=8 bits with minimal analog circuitry. This ENOB figure has been provided by the decimation filtering which has suppressed the quantisation noise of the PDM structure.

SUMMARY

It can be seen, therefore, that a Radio Frequency (RF) Analog to Digital Converter (ADC) is described in which the ADC is 'all-digital' with respect to the input signal path and has no discrete-time analog switching components. A Pulse Density Modulation (PDM) method of implementing an ADC is used which comprises a clocked comparator and a passive low-pass feedback filter. This has a narrow aperture time which can be used beneficially to bandpass sample a signal and effect direct down-conversion from radio frequency to baseband. To convert a single real-valued input RF signal into down-converted IQ (quadrature) form for subsequent baseband processing, an array of PDM blocks at multiple clock phase delays may be used to capture the complex signal information. Digital signal processing (DSP) of the multiple PDM streams may then be used to filter and recombine the signal into a high-fidelity IQ baseband stream. The clock phase delays (which are typically previously calibrated and stored) may be compensated for during this DSP.

The bandpass sampling provided by the PDM circuitry described has the potential to provide benefits over other solutions such as the use of conventional Bandpass Delta-Sigma Modulation (BPDSM) ADCs, conventional radio receiver technology and lowpass analog to digital conversion technology.

In the Pulse Density Modulator (PDM) circuits, a near-instantaneous sampling capability exhibited when the voltage comparison output is latched by a digital clock edge, is advantageously used to effect bandpass sampling and direct down-conversion of radio frequency signals. The PDM circuit may be clocked by a signal which is close to or an integer divisor of the specified carrier frequency which, in doing so, down-converts the input radio frequency signal from the said carrier frequency to baseband.

The bandwidth of the signal which can be down-converted is proportional to the bandwidth of the feedback resistor-capacitor (RC) network in the PDM circuit.

Multiple instances of the PDM blocks may be clocked at multiple phase offsets of a source digital clock to enable construction of a desired IQ baseband signal. A method to achieve this (but not exclusively restricted to) is to have two PDM blocks at 90 degrees phase offset (with respect to the carrier) which directly generates I and Q components.

The clock delays to the multiple PDM blocks may be calibrated and stored to enable precise recombination to the signals in the digital signal processing back into I and Q components.

A particularly beneficial implementation of a radio receiver may utilise the circuitry as described herein, potentially at an appropriate intermediate frequency (IF).

Similarly, a particularly beneficial implementation of a radio transceiver may utilise the circuitry as described herein.

It can be seen that the PDM circuitry described has many potential benefits including minimal analog circuitry in the signal input path and the fact that it can be made predominantly digital using "library" circuits such as dynamic latch comparators. This means that it has the potential to be used provide lower cost and lower power application solutions that are relatively easy to design and to port between processes and geometries.

A PDM circuit with a programmable frequency sample clock can capture a range of radio carrier frequencies and thus displays a high level of frequency agility (subject to suitable bandpass anti-aliasing filtering).

Whilst detailed embodiments have been described above, as those skilled in the art will appreciate, a number of modifications and alternatives can be made to the above embodiments whilst still benefiting from the inventions embodied therein. By way of illustration only a number of these alternatives and modifications will now be described.

It will be appreciated, for example, that the PDM circuitry described above may be implemented on an application-specific integrated circuit (ASIC) or a field-programmable gate array (FPGA). The analog input signal may, for example, be routed via one or more serialiser/deserialiser (SerDes) inputs on an FPGA.

A particularly advantageous, fast and efficient, implementation of the latched comparator may be "dynamic latch comparators" used, for example, at the Serialiser-Deserialiser inputs of Field Programmable Gate Arrays (FPGAs). This example takes advantage of the fact that the dynamic latch comparators allow near-instantaneous samples to be taken of the voltage comparison output, at clock edge events.

The sampling frequency may, advantageously, be derived from a programmable-frequency clock generator thereby allowing the sampling frequency of the circuit to be easily changed.

The PDM circuit may typically be used with radio signals having carrier frequencies between hundreds of MHz and tens of GHz (e.g. in the range 800 MHz to 28 GHz) although operation outside these ranges is possible. The PDM circuitry may, for example, be used in a range of operation between 800 MHz and 2600 MHz as used in LTE networks or may be used (e.g. for Wi-Fi and/or 5G operation) in the GHz range.

Various other modifications will be apparent to those skilled in the art and will not be described in further detail here.

The invention claimed is:

1. A circuit for sampling an analog input signal, the circuit comprising:
   input circuitry for receiving an analog input signal modulated at an associated non-baseband carrier frequency;
   sampling circuitry for sampling the received analog input signal modulated at the associated non-baseband carrier frequency, wherein said sampling comprises converting the analog input signal to provide an output comprising a discrete-time signal with discrete amplitude levels; and
   clocking circuitry for clocking the sampling circuitry at a sampling frequency, wherein the sampling circuitry samples the analog input signal modulated at the associated non-baseband carrier frequency at a rate corresponding to the sampling frequency, and wherein the sampling frequency is equal to the carrier frequency, or is equal to the carrier frequency divided by an integer greater than one;
   wherein the sampling circuitry comprises at least one pulse density modulator, wherein each pulse density modulator comprises a respective comparator that is configured to receive an analog input modulated at the associated non-baseband carrier frequency as an input directly to the comparator, and to be clocked by the clocking circuitry at the sampling frequency equal to the carrier frequency, or equal to the carrier frequency divided by an integer greater than one, wherein to provide bandpass sampling, of the analog input signal modulated at the associated non-baseband carrier frequency, at the sampling frequency, and to produce a corresponding pulsed output that is pulse density modulated to represent the analog signal amplitude of the analog input signal.

2. A circuit as claimed in claim 1, wherein the comparator of the sampling circuitry is arranged to down-convert the analog input signal modulated at the associated non-baseband carrier frequency from the carrier frequency associated with the analog input signal to generate said pulsed output that is pulse density modulated to represent said analog signal amplitude of said analog signal at a baseband frequency or modulated at an intermediate frequency.

3. A circuit as claimed in claim 1, wherein said analog input signal comprises at least one of a radio frequency signal and a signal derived from a radio frequency signal.

4. A circuit as claimed in claim 1, wherein each pulse density modulator comprises a feedback circuit.

5. A circuit as claimed in claim 4, wherein the feedback circuit is configured to provide closed-loop negative feedback.

6. A circuit as claimed in claim 4, wherein the feedback circuit comprises a resistor-capacitor circuit.

7. A circuit as claimed in claim 6, wherein the resistor-capacitor circuit has an associated time constant configured to provide a predetermined bandwidth, wherein a maximum bandwidth of a signal which can be down-converted by the sampling circuitry is proportional to the predetermined bandwidth of the resistor-capacitor circuit.

8. A circuit as claimed in claim 1, wherein the sampling circuitry comprises a plurality of the pulse density modulators, each of the pulse density modulators arranged to produce a respective pulse density modulated output to represent the analog signal amplitude of the analog input signal.

9. A circuit as claimed in claim 8, wherein said clocking circuitry is arranged to clock the respective comparator of each pulse density modulator of the plurality of pulse density modulators with a different respective delay to cause each pulse density modulator to sample the analog input signal at a different respective phase offset.

10. A circuit as claimed in claim 9, wherein the plurality of pulse density modulators comprise two pulse density modulators the comparators of which are clocked with a relative clock delay arranged to cause the two pulse density modulators to sample the analog input signal at a relative phase offset of 90 degrees.

11. A circuit as claimed in claim 9, wherein the different respective delays are configured to cause each pulse density modulator to sample the analog input signal at a phase offset of 360/M degrees where M is the number of pulse density modulators.

12. A circuit as claimed in claim 9, further comprising circuitry for calibrating and storing the different respective delays.

13. A circuit as claimed in claim 12, further comprising a digital signal processor configured for precise mathematical recombination of pulse density modulation (PDM) signals output from the pulse density modulators back into in-phase and quadrature components based on the different respective delays stored by the calibrating and storing circuitry.

14. A circuit as claimed in claim 1, wherein the circuit is formed of at least one digital circuit component.

15. A circuit as claimed in claim 1, wherein the sampling frequency is derived from a programmable-frequency clock generator.

16. A circuit as claimed in claim 1 implemented using a field programmable gate array or application specific integration circuit (ASIC).

17. An analog to digital converter comprising a circuit as claimed in claim 1.

18. A radio receiver comprising a circuit as claimed in claim 1.

19. A radio receiver as claimed in claim 18, configured to operate the circuit at an Intermediate Frequency (IF).

20. A radio transceiver comprising a circuit as claimed in claim 1.

21. A method for sampling an analog input signal, the method comprising:

receiving an analog input signal modulated at an associated non-baseband carrier frequency; and sampling the analog input signal modulated at the associated non-baseband carrier frequency at a sampling frequency, wherein the sampling frequency is equal to the carrier frequency, or equal to the carrier frequency divided by an integer greater than one, wherein said sampling comprises converting the analog input signal to provide an output comprising a discrete-time signal with discrete amplitude levels; and wherein the sampling comprises clocking a comparator of at least one pulse density modulator at the sampling frequency equal to the carrier frequency, or equal to the carrier frequency divided by an integer greater than one; wherein the comparator receives as an input directly to the comparator, an analog input modulated at the associated non-baseband carrier frequency, and bandpass samples the analog input signal modulated at the associated non-baseband carrier frequency at the sampling frequency equal to the carrier frequency, or equal to the carrier frequency divided by an integer greater than one, to produce a corresponding pulsed output that is pulse density modulated to represent the analog signal amplitude of the analog input signal.

22. A method as claimed in claim 21, wherein the comparator of the sampling circuitry down-converts the analog input signal modulated at the associated non-baseband carrier frequency, from the carrier frequency associated with the analog input signal, to generate said pulsed output that is pulse density modulated to represent said analog signal amplitude of said analog signal at a baseband frequency or modulated at an intermediate frequency.

* * * * *